United States Patent
Yoshimoto et al.

(10) Patent No.: US 12,272,548 B2
(45) Date of Patent: *Apr. 8, 2025

(54) METHOD OF FORMING AN ELECTRONIC STRUCTURE USING REFORMING GAS, SYSTEM FOR PERFORMING THE METHOD, AND STRUCTURE FORMED USING THE METHOD

(71) Applicant: ASM IP Holding B.V., Almere (NL)

(72) Inventors: Shinya Yoshimoto, Tama (JP); Jun Yoshikawa, Hachioji (JP); Toshihisa Nozawa, Kawasaki (JP)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/410,333

(22) Filed: Jan. 11, 2024

(65) Prior Publication Data

US 2024/0162037 A1    May 16, 2024

Related U.S. Application Data

(63) Continuation of application No. 17/944,583, filed on Sep. 14, 2022, now Pat. No. 11,908,684, which is a continuation of application No. 16/896,238, filed on Jun. 9, 2020, now Pat. No. 11,476,109.

(60) Provisional application No. 62/860,158, filed on Jun. 11, 2019.

(51) Int. Cl.
H01L 21/02 (2006.01)
H01L 21/285 (2006.01)

(52) U.S. Cl.
CPC ...... H01L 21/0217 (2013.01); H01L 21/0228 (2013.01); H01L 21/28518 (2013.01)

(58) Field of Classification Search
None
See application file for complete search history.

(56) References Cited

U.S. PATENT DOCUMENTS

| | | | |
|---|---|---|---|
| 10,017,853 B2 | 7/2018 | Nakanishi et al. | |
| 11,476,109 B2 * | 10/2022 | Yoshimoto | H01L 21/0234 |
| 11,908,684 B2 * | 2/2024 | Yoshimoto | H01L 21/28518 |
| 2017/0323786 A1 | 11/2017 | Kang et al. | |

FOREIGN PATENT DOCUMENTS

JP    2007027777 A    2/2007

* cited by examiner

*Primary Examiner* — Asok K Sarkar
(74) *Attorney, Agent, or Firm* — Snell & Wilmer L.L.P.

(57) ABSTRACT

Methods of and systems for reforming films comprising silicon nitride are disclosed. Exemplary methods include providing a substrate within a reaction chamber, forming activated species by irradiating a reforming gas with microwave radiation, and exposing substrate to the activated species. A pressure within the reaction chamber during the step of forming activated species can be less than 50 Pa.

20 Claims, 11 Drawing Sheets

METHOD OF FORMING AN ELECTRONIC STRUCTURE USING REFORMING GAS, SYSTEM FOR PERFORMING THE METHOD, AND STRUCTURE FORMED USING THE METHOD

CROSS-REFERENCE TO RELATED APPLICATIONS

This application is a continuation of, and claims priority to, U.S. patent application Ser. No. 17/944,583 filed Sep. 14, 2022 titled METHOD OF FORMING AN ELECTRONIC STRUCTURE USING REFORMING GAS, SYSTEM FOR PERFORMING THE METHOD, AND STRUCTURE FORMED USING THE METHOD; which is a continuation of U.S. patent application Ser. No. 16/896,238, filed Jun. 9, 2020, and titled METHOD OF FORMING AN ELECTRONIC STRUCTURE USING REFORMING GAS, SYSTEM FOR PERFORMING THE METHOD, AND STRUCTURE FORMED USING THE METHOD (now U.S. Pat. No. 11,476,109 issued Oct. 18, 2022), which claims the benefit of U.S. Provisional Patent Application No. 62/860,158 filed on Jun. 11, 2019, the disclosures of which are incorporated herein in their entirety by reference.

FIELD OF INVENTION

The present disclosure generally relates to methods of treating material on a surface of a substrate, to structures formed using the method, and to systems for treating the material.

BACKGROUND OF THE DISCLOSURE

Conformal film deposition may be desirable for a variety of reasons. For example, during the manufacture of devices, such as semiconductor devices, it is often desirable to conformally deposit material over features formed on the surface of a substrate. Such techniques can be used for shallow trench isolation, inter-metal dielectric layers, passivation layers, and the like. However, with miniaturization of devices, it becomes increasingly difficult to conformally deposit material, particularly over high aspect ratio features, such as features having an aspect ratio of three or more.

Atomic layer deposition (ALD) can be used to conformally deposit material onto a surface of a substrate. For some applications, such as when precursors and/or reactants otherwise require a relatively high temperature for ALD deposition and/or when it is desired to keep a processing temperature relatively low, it may be desirable to use plasma-enhanced ALD (PE-ALD).

Unfortunately, material deposited using PE-ALD can exhibit relatively poor film quality—e.g., exhibit a relatively high etch rate in a liquid or gas-phase etchant. For example, silicon nitride films deposited using PE-ALD can exhibit relatively high etch rates in dilute hydrofluoric acid (e.g., 1:100 by volume $HF:H_2O$), compared to silicon nitride films deposited without the aid of a plasma. Efforts to improve low quality of PE-ALD deposited material have focused on tuning deposition parameters, such as RF power, plasma exposure time, pressure, as well as precursors used to deposit the material. However, such techniques may not produce desired film quality and/or film uniformity, particularly along a dimension (e.g., height) of a feature including the film.

Accordingly, improved methods for forming high-quality material, such as silicon nitride, on a substrate and structures formed using such methods are desired. Any discussion of problems and solutions described in this section has been included solely for the purposes of providing a context for the present invention and should not be taken as an admission that any or all of the discussion was known at the time the invention was made.

SUMMARY OF THE DISCLOSURE

Various embodiments of the present disclosure relate to methods of forming high-quality films using PE-ALD. While the ways in which various embodiments of the present disclosure address drawbacks of prior methods and systems are discussed in more detail below, in general, various embodiments of the disclosure provide improved methods that include a reforming step to improve a quality of a deposited film.

In accordance with at least one embodiment of the disclosure, a method of forming an electronic device structure includes providing a substrate within a reaction chamber, forming activated species by irradiating a reforming gas with microwave radiation, and exposing a layer comprising silicon nitride to the activated species. A pressure within the reaction chamber during the step of forming activated species can be less than 50 Pa. The layer comprising silicon nitride can be deposited overlying features (e.g., trenches or protrusions, such as fins) formed on the surface of the substrate. The reforming gas can include hydrogen and one or more of helium and argon. The reforming gas can also include a nitrogen source gas, such as one or more of the group consisting of $N_2$ and $NH_3$. By way of examples, the reforming gas can comprise, consist of, or consist essentially of hydrogen, optionally a nitrogen source gas, and one or more of helium and argon. An amount of helium, hydrogen, and/or argon in the reforming gas can each range from about 5% to about 95%, about 20% to about 70%, 40% to about 60%, or be about 50% by volume. The reforming gas comprises 0% or greater than 0% and less than 10% or less than 5% by volume of nitrogen source gas. The microwave radiation can be emitted from an antenna (e.g., a pole-type antenna) provided above the susceptor in the reaction space. The methods described herein can be used to form layers deposited in the manufacture of 3D NAND and/or Fin-FET devices.

In accordance with yet further exemplary embodiments of the disclosure, a deposition apparatus configured to perform a method as described herein is provided.

In accordance with yet further exemplary embodiments of the disclosure, a structure comprises a layer formed according to a method described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
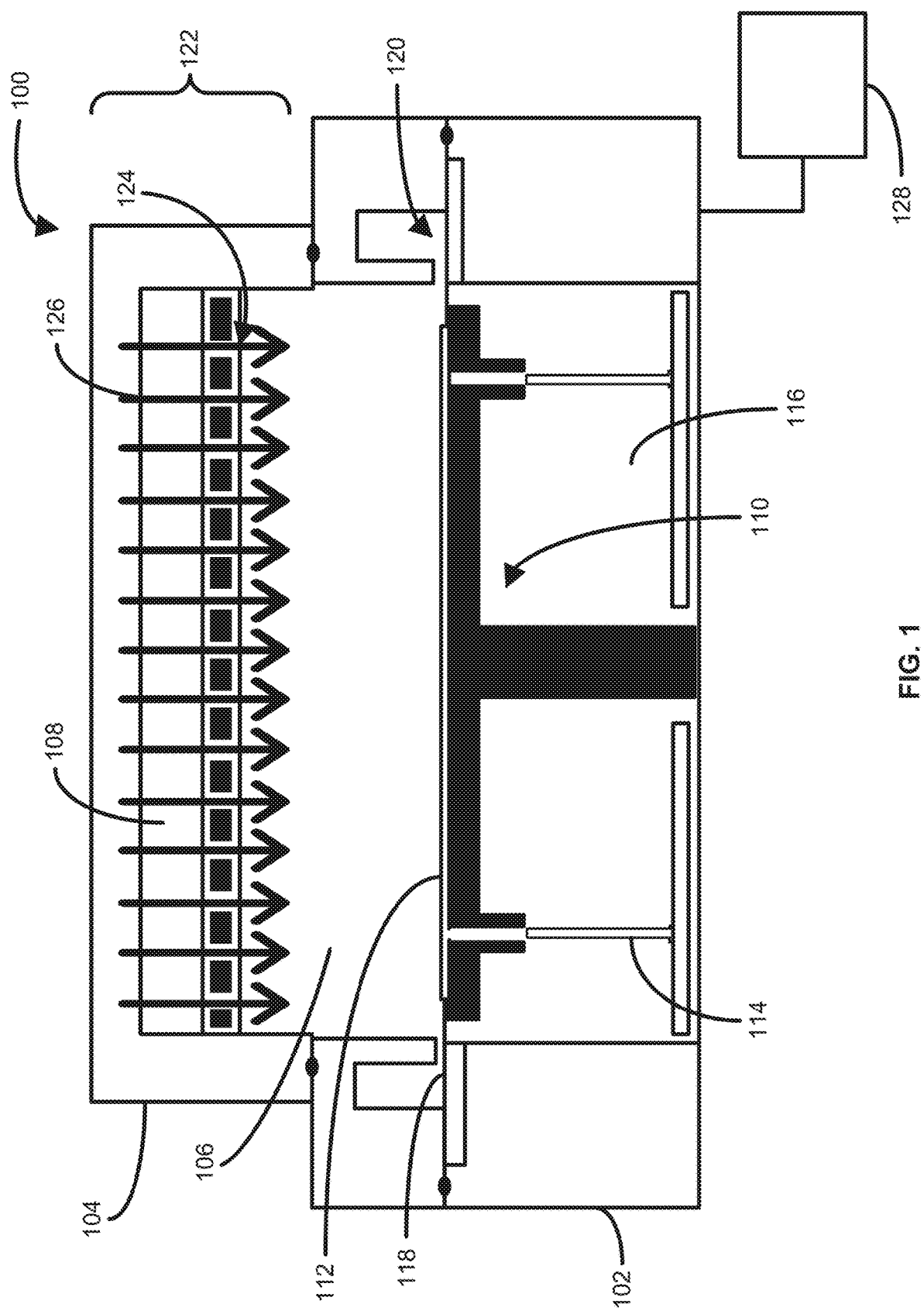
FIG. 1 illustrates a reactor system in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming electronic device structures, to deposition apparatus for performing the methods, and to structures formed using the method. By way of examples, the systems and methods described herein can be used to form high-quality silicon nitride films. The silicon nitride films can be deposited (e.g., conformally) using PE-ALD onto a surface of a substrate, which can include high-aspect ratio features. The PE-ALD deposited material can then be exposed to activated species formed by irradiating a reforming gas with microwave radiation to form a structure including high-quality silicon nitride films.

In this disclosure, "gas" may include material that is a gas at room temperature and pressure, a vaporized solid and/or a vaporized liquid, and may be constituted by a single gas or a mixture of gases, depending on the context. A gas other than the process gas, i.e., a gas introduced without passing through a gas distribution assembly, such as a showerhead, other gas distribution device, or the like, may be used for, e.g., sealing the reaction space, which includes a seal gas, such as a rare gas. In some embodiments, the term "precursor" refers generally to a compound that participates in the chemical reaction that produces another compound, and particularly to a compound that constitutes a film matrix or a main skeleton of a film, whereas the term "reactant" refers to a compound, other than precursors, that activates a precursor, modifies a precursor, or catalyzes a reaction of a precursor, wherein the reactant may provide an element (such as O, N, C) to a film matrix and become a part of the film matrix, when, for example, RF power is applied. The term "inert gas" refers to a gas that does not take part in a chemical reaction and/or a gas that excites a precursor when RF power is applied, but unlike a reactant, it may not become a part of a film matrix to an appreciable extent.

"Reforming gas" can refer to a gas used for post-deposition treatment or introduced to the reaction space during post-deposition treatment. In some cases, the reforming gas does not include precursor, reactant, and/or additive gas used for deposition gas to deposit material that is being reformed by the reforming gas. The reforming gas may include a seal gas, other inert gas, or other additive gas. When the reforming gas is constituted by multiple gases, it can be introduced as a mixed gas or separately to a reaction space. The reforming gas can be introduced to the reaction space through a shower plate or other gas inflow port which is capable of feeding the gas uniformly to the reaction space or uniformly around an antenna for generating a direct microwave plasma installed in the reaction space. The reforming gas may be introduced to the reaction space upstream of the antenna or toward a surface of the antenna facing the susceptor.

As used herein, the term "substrate" may refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various topologies, such as recesses, lines, and the like formed within or on at least a portion of a layer of the substrate.

In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers.

As used herein, the term "atomic layer deposition" (ALD) may refer to a vapor deposition process in which deposition cycles, typically a plurality of consecutive deposition cycles, are conducted in a process chamber. Typically, during each cycle, the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor composition(s), reactive gas, and purge (e.g., inert carrier) gas. PE-ALD refers to an ALD process, in which a plasma is applied during one or more of the ALD steps.

As used herein, the term "a layer comprising silicon nitride" refers to a layer that includes silicon and nitrogen. Unless otherwise noted, a layer comprising silicon nitride can include additional elements, such as oxygen and/or carbon. By way of examples, a layer comprising silicon nitride can include SiNx, where x ranges from about 1 to about 1.33, or SiOCN films.

Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

In this disclosure, "continuously" can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments.

Turning now to the figures, FIG. 1 illustrates a system 100 for forming an electronic device structure as described herein. System 100 includes a reaction chamber 102 and a plasma-generating chamber 104 disposed above reaction chamber 102, wherein an interior region 106 of reaction chamber 102 is in fluid communication with an interior region 108 of plasma-generating chamber 104. System 100 further includes a susceptor 110, which, in the illustrated example, is capable of moving vertically to load and unload a substrate 112. Lift pins 114 and a robot arm (not shown) can be used to load and unload the substrate from the surface of susceptor 110. When susceptor 110 is at an upper position or processing position, interior region 106 (or reaction space) of the reaction chamber 102 is separated from a loading/unloading section 116 by an isolation ring 118. The reaction space 106 can be evacuated via an annular exhaust duct 120.

During operation of system 100, a reforming gas and/or other gas can be supplied to the reaction space 106 from the plasma-generating chamber 104. In the illustrated example, plasma-generating chamber 104 constitutes a plasma-generating section 122 right above the reaction space 106. An antenna, such as a pole-type microwave antenna 124 can be disposed facing substrate 112 and can be parallel to susceptor 110, so that microwaves can be uniformly transmitted toward the substrate while the reforming gas is fed to the plasma-generating chamber 104 (e.g., in the direction of arrows 126). The pole-type microwave antenna 124 can be provided with and connected to magnetrons (not shown) typically attached at the ends of antenna 124 to feed microwaves into antenna 124.

In some embodiments, the pole-type microwave antenna is enclosed in a quartz or ceramic tube which functions as a microwave window, wherein a plasma grows from both ends and extends along the tube, thereby forming an axially-homogeneous microwave plasma. Multiple pole-type microwave antennas (e.g., 2, 4, or 8) can be installed in parallel to each other to form a two-dimensional plasma array for forming a uniform plasma with reference to a surface of substrate 112. Since a microwave plasma is a direct microwave plasma, no magnetic coil may be used (i.e., no magnetic field formed to generate a plasma). Further, no bias voltage may be supplied to the susceptor 110, so as to prevent ion energy from becoming too high and causing damage to the film or etching of the film. Alternatively, a slot antenna (a plate-type antenna with multiple slots) can be used to generate a surface wave plasma, wherein a shower plate for feeding a reforming gas to the reaction space is installed above the slot antenna at a short distance (upstream of the slot antenna). Any other microwave antennas, including conventional antennas, suitable for generating a direct microwave plasma can be used. The direct microwave plasma which contains both radicals and ions is different from a remote plasma which contains primarily radicals and substantially no ions.

System 100 can include one or more controller(s) 128 programmed or otherwise configured to cause the reforming or other steps described herein. Controller(s) 128 can be communicated with the various power sources, heating systems, pumps, robotics and gas flow controllers or valves of the reactor.

Figure 2:
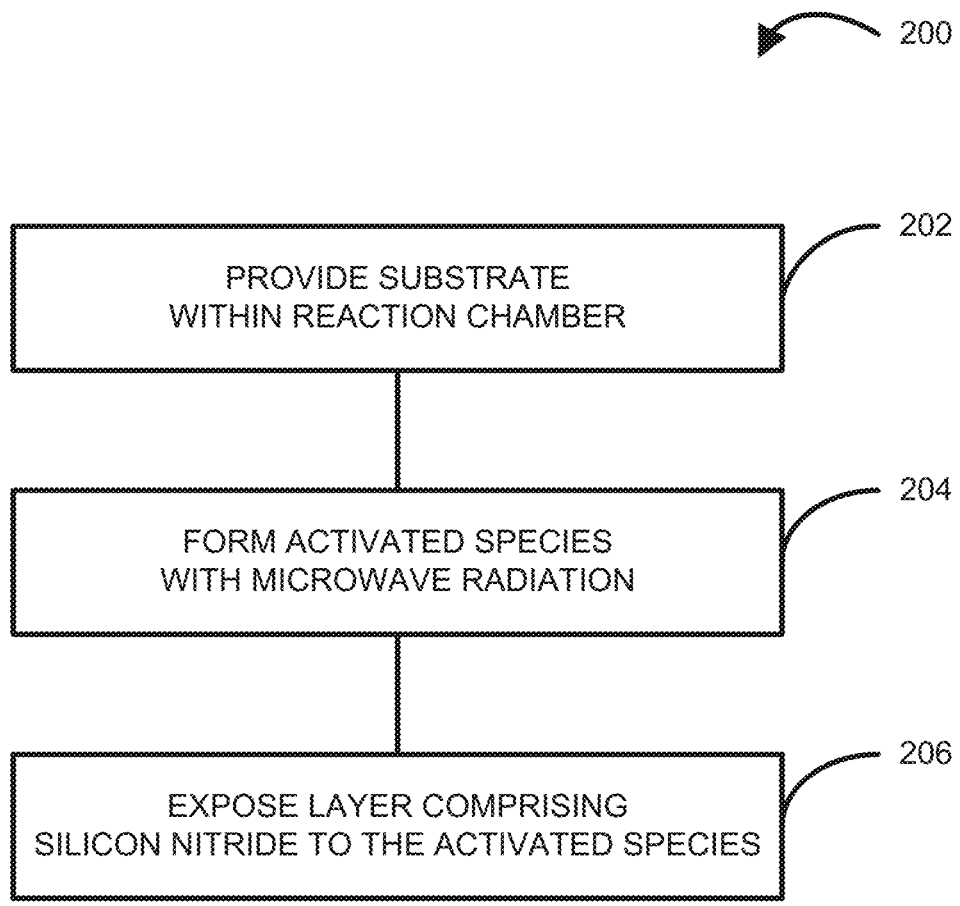
FIG. 2 illustrates a method of forming a structure in accordance with at least one embodiment of the disclosure.

FIG. 2 illustrates a method 200 in accordance with additional embodiments of the disclosure. Method 200 includes the steps of providing a substrate within a reaction chamber (step 202), forming activated species by irradiating a reforming gas with microwave radiation (step 204), and exposing a layer comprising silicon nitride to the activated species (step 206). In some embodiments, method 200 is conducted during a process of forming a 3D NAND device or a Fin-FET device.

During step 202, the substrate provided within the reaction chamber can include features, such as trenches, vias, or protrusions. The substrate can further include a layer comprising silicon nitride overlying the features. One or more features can have a width of about 10 nm to about 100 nm, a depth or height of about 30 nm to about 1000 nm, and/or an aspect ratio of about 3 to 100 or about 3 to about 20.

In some cases, the substrate includes features, wherein the layer comprising silicon nitride may have inferior quality (e.g., higher wet etch rates) at sidewalls of the features as compared with a quality of the layer comprising silicon nitride, at, for example, a top surface of the feature.

During step 202, the substrate can be brought to a desired temperature and pressure for subsequent processing. By way of examples, a substrate temperature or a temperature of a susceptor can be brought to a temperature of about 20° C. to about 400° C. or 140° C. to 260° C. A pressure within the reaction chamber during the step of forming activated species is less than 50 PA or between about 1 Pa to about 30 Pa or about 0.1 Pa to less than 50 Pa.

In some embodiments, step 202 includes depositing the silicon nitride film on the substrate by plasma-enhanced ALD (PE-ALD) in a PE-ALD apparatus, and then transferring the substrate to the reaction space in a microwave plasma apparatus without exposing the substrate to air. Silicon nitride is relatively chemically stable and thus, exposure of the silicon nitride film to air before the reforming step may not cause a problem; however, when the silicon nitride film is very thin, e.g., a thickness is approximately 3 nm, oxidation of an exposed surface of the film may affect the property of a final product or the operation of subsequent processes. In this case, a PE-ALD apparatus and a microwave plasma apparatus (e.g., used for deposition of the silicon nitride file) can be installed within the same module and connected via a back-end robot. This way, the substrate can be transferred from the PE-ALD apparatus to the microwave plasma apparatus without exposing the substrate to air.

In some embodiments, the silicon nitride film is deposited by PE-ALD since PE-ALD is capable of depositing a film with high conformality (e.g., 80% to 100%, preferably 90% or higher, wherein the conformality is defined as a ratio (%) of thickness of film at the center of a sidewall of a trench to thickness of film at the center of a top surface on which the trench is formed) at a relatively low temperature (e.g., 400° C. or lower). However, other processes, such as thermal ALD or LPCVD, can be used to deposit a silicon nitride film by using a relatively high temperature (e.g., 600° C. or higher). An exemplary PE-ALD process can include exposing the substrate to a silicon precursor, such as silane, halogensilane (dichlorosilane, diiodosilane, hexachlorodisilane, octachlorotrisilane), organosilane (tris(dimethylamino)silane, Bis(tert-butylamino)silane, di(sec-butylamino)silane), and heterosilane (trisilylamine, neopentasilane), purging the reaction chamber, expositing the substrate to activated nitrogen species formed by exposing a nitrogen-containing gas (e.g., nitrogen source gas), such as nitrogen, for example, to radio frequency radiation, purging the reaction chamber, and repeating these steps until a desired thickness of a layer comprising silicon nitride is obtained.

During step 204, activated species are formed by irradiating a reforming gas with microwave radiation. A pressure and temperature within a reaction space during step 204 can be the same or similar to the temperature and pressure within the reaction space during step 202.

In some embodiments, the microwaves have a frequency of 800 MHz to 10 GHz. Since microwaves have a significantly higher frequency than an RF frequency (typically 13.56 MHz), a plasma having a high density can be generated using microwaves. For example, a cut-off frequency (f [Hz]) can be calculated as $f \approx 9 \cdot \sqrt{(ne)}$ wherein ne is a plasma density $[/m^3]$. If the cut-off frequency is 13.56 MHz, the plasma density is approximately $2 \times 1012/m^3$, whereas if the cut-off frequency is 2.45 GHz, the plasma density is approximately $4 \times 1016/m^3$, indicating that electric power can be supplied to a plasma until the plasma density reaches a significantly higher level when using microwaves than when using RF waves, i.e., microwaves are more effective than RF waves as a plasma source. Further, electron temperature obtained when using microwaves is lower than that obtained when using RF waves. Additionally, ions follow RF waves and swing, whereas ions do not follow microwaves and thus do not swing. The excited state of atoms and molecules by microwaves is different from that by RF waves.

The plasma density is also referred to as "electron density" or "ion saturation current density" and refers to the number of free electrons per unit volume. The plasma density in the reaction space can be measured using a Langmuir probe (e.g., LMP series).

By using microwaves (having an ultra-high frequency of typically 800 MHz or higher), the plasma density can be increased (for example, the plasma density of a microwave (2.45 GHz) plasma is at least one to two digits higher than that of an RF (13.56 MHz) plasma, and electron temperature of the microwave plasma is a half or less of that of the RF plasma).

In some embodiments, in order to generate a homogeneous or uniform plasma in the reaction space, an antenna, such as antenna 124, is provided away from the susceptor at a distance of about 5 cm to about 10 cm between the antenna and the susceptor. In some embodiments, a susceptor, such as susceptor 110, is continuously or intermittently (e.g., rotating the susceptor by 90° once or multiple times) rotated during step 204 to facilitate formation of a homogeneous or uniform plasma within a reaction space.

In some embodiments, microwave power of emitting the microwaves is between about 500 W and about 10,000 W (preferably, between about 1,000 W and about 3,000 W). The above-indicated power is for a 300-mm wafer and can be converted to $W/cm^2$ (wattage per unit area of a wafer) as 0.71 $W/cm^2$ to 14.15 $W/cm^2$ (preferably 1.41 $W/cm^2$ to 4.24 $W/cm^2$) which can apply to a wafer having a different diameter such as 200 mm or 450 mm.

In some embodiments, the reforming gas can include hydrogen and/or helium. For example, the reforming gas can be helium or include about 0.1% to about 99.9% by volume of He. In some embodiments, the reforming gas can include about 0.1% to about 99.9% by volume of He. In some examples, the reforming gas can include hydrogen and one or more of helium and argon. By way of examples, the reforming gas contains about 5% to about 95%, about 20% to about 70% by volume, or about 40% to about 60% by volume of He. Additionally or alternatively, the reforming gas can include about 5% to about 95%, about 20% to about 70% by volume, or about 40% to about 60% by volume of Ar. An amount of hydrogen in the reforming gas can range from about 5% to about 95%, about 20% to about 70% by volume, or about 40% to about 60% by volume.

The reforming gas can also include a nitrogen source gas, such as of $N_2$ and/or $NH_3$. The reforming gas can include no nitrogen source gas or from greater than 0% and to less than 10% by volume or from greater than 0% and to less than 5% by volume of nitrogen source gas.

In some embodiments, only the reforming gas is supplied to the reaction space during step 204—i.e., no precursor nor reactant gas is supplied to the reaction space during this step. Further, during step 204, no film is deposited on the substrate, i.e., the thickness of the silicon nitride film is not increased; in some embodiments, the thickness of the silicon nitride film may be decreased (e.g., by approximately 3 nm) due to the etching effect of excited reforming gas (generating, e.g., a hydrogen plasma). Typically, the thickness of the silicon nitride film does not change substantially during the reforming step.

Although separately illustrated, steps 204 and 206 can occur at substantially the same time. A pressure and temperature within a reaction chamber during step 206, also referred to herein as a reforming step, can be the same or similar to the pressure and temperature noted above in connection with steps 202 and 204.

Table 1 below illustrates exemplary process conditions for steps 202-206 of method 200.

TABLE 1

| Conditions for Step 204 | |
|---|---|
| Pressure | >0 to <50 Pa (of 0.1 to 30 Pa) |
| Substrate temperature | 20 to 400° C. (or 50 to 250° C.) |
| Reforming gas | He, $H_2$, He + $H_2$, Ar + $H_2$ (all with or without a nitrogen source gas) |
| Flow rate of reforming gas (continuous) | 1 to 1000 sccm (or 10 to 100 sccm) |
| Frequency of microwaves | 0.9 to 10 GHz (or 0.9 to 5.8 GHz) |
| Microwave power for a 300-mm wafer | 500 to 10,000 W (or 1,000 to 3,000 W) |

TABLE 1-continued

Conditions for Step 204

| | |
|---|---|
| Distance between antenna and susceptor (a thickness of a substrate is about 0.7 mm) | 50 to 300 mm (or 50 to 100 mm) |
| Duration of reformation step | 0.1 to 30 min. (or 3 to 10 min.) |

The above-indicated microwave power for a 300-mm wafer can be converted to W/cm² (wattage per unit area of a wafer) which can apply to a wafer having a different diameter such as 200 mm or 450 mm. The substrate temperature can be considered to be a temperature of the reaction space during the film reformation.

During steps 204 and 206, by irradiating the reforming gas with microwaves at a low pressure (e.g., less than 50 Pa), a reforming gas plasma can be generated, which is highly effective in reforming the silicon nitride film including any portions of the film deposited on the sidewalls of features, thereby realizing the silicon nitride film having substantially uniform or homogeneous quality regardless of locations (e.g., along a height of a feature) of the silicon nitride film. For example, the silicon nitride film can have geographically or topologically substantially uniform or homogeneous quality (e.g., a variation of the etched quantity) in a preset duration of wet etching or per unit of time depending on the geographical or topological locations, e.g., top surface, sidewall, and bottom, may be ±30% or less, typically ±20% or ±10% or ±5% less with reference to the average etched quantity at the locations for the aspect ratios noted herein.

In some embodiments, the silicon nitride film has a thickness of 3 nm or more, and step 206 can continue until the silicon nitride film is reformed from its surface to a depth of 3 nm or more. Reforming the silicon nitride can be conducted by desorbing and releasing hydrogen and halogen (if included in the precursor) from the silicon nitride film, and the content of hydrogen and halogen at a portion of the silicon nitride film is indicative of accomplishment of reformation of the portion, i.e., by analyzing the content of hydrogen and halogen in a thickness direction, it can be determined to what depth the film is reformed. In some embodiments, when the silicon nitride film is reformed from its surface to a depth of 3 nm or more, the reforming effect is considered to be sufficient to improve the film quality, such as having high resistance to chemicals (which can be evaluated by WERR). When the silicon nitride film has a thickness of, for example, 10 nm or more and if it is desired to reform the film from its surface to a depth of 10 nm or more, the reforming step may be repeated after every 10 nm of accumulated deposition of the film or after a predetermined number of deposition cycles. However, in some cases, since a direct microwave plasma can penetrate the film from its surface to a depth of more than 10 nm, e.g., approximately 40 nm, by manipulating process parameters including the reforming step duration, pressure, temperature, and microwave power, the film may be reformed in its entirety without repeating the deposition step and reforming step.

FIGS. 3-11 illustrate various examples of the disclosure. These examples are not intended to limit the present invention. In the examples, where conditions and/or structures are not specified, the skilled artisan in the art can readily provide such conditions and/or structures, in view of the present disclosure, as a matter of routine experimentation. Also, the numbers applied in the specific examples can be modified by a range of at least ±50% in some embodiments, and the numbers are approximate.

Unless otherwise noted, the samples for the examples included features having an aspect ratio of about 5.5, with a bottom depth of about 330 nm. The samples were etched for about 2.5 minutes. "AsDEP" in the figures refers to films that were not exposed to a reforming process. Depth refers to a depth within a feature (trench). The silicon nitride films were deposited using the following conditions.

TABLE 2

Conditions for depositing SiN film

| | Exemplary Range | Exemplary Value |
|---|---|---|
| Precursor diiodosilane feed (sccm) | | |
| Reactant $H_2$ feed (slm) | 0 to 0.1 | 0 |
| Reactant $N_2$ feed (slm) | 1 to 10 | 10 |
| Carrier $N_2$ feed (slm) | 1 to 8 | 4 |
| Sealing $N_2$ feed (slm) | 0.05 to 0.3 | 0.2 |
| Pressure (Pa) | 300 to 4000 | 3000 |
| RF (13.56 MHz) (W) | 100 to 1000 | 880 |
| Susceptor temperature (° C.) | 100 to 400 | 250 |
| Shower head temperature (° C.) | 100 to 200 | 180 |
| Chamber wall temperature (° C.) | 100 to 180 | 150 |
| Electrode gap (mm) | 8 to 15 | 10 |
| Feed time (sec.) | 0.1 to 3 | 0.3 |
| Purge time (once) (sec.) | 0.5 to 3 | 1.0 |
| Cycle number | | 800 |

(numbers are approximate)

Figure 3:
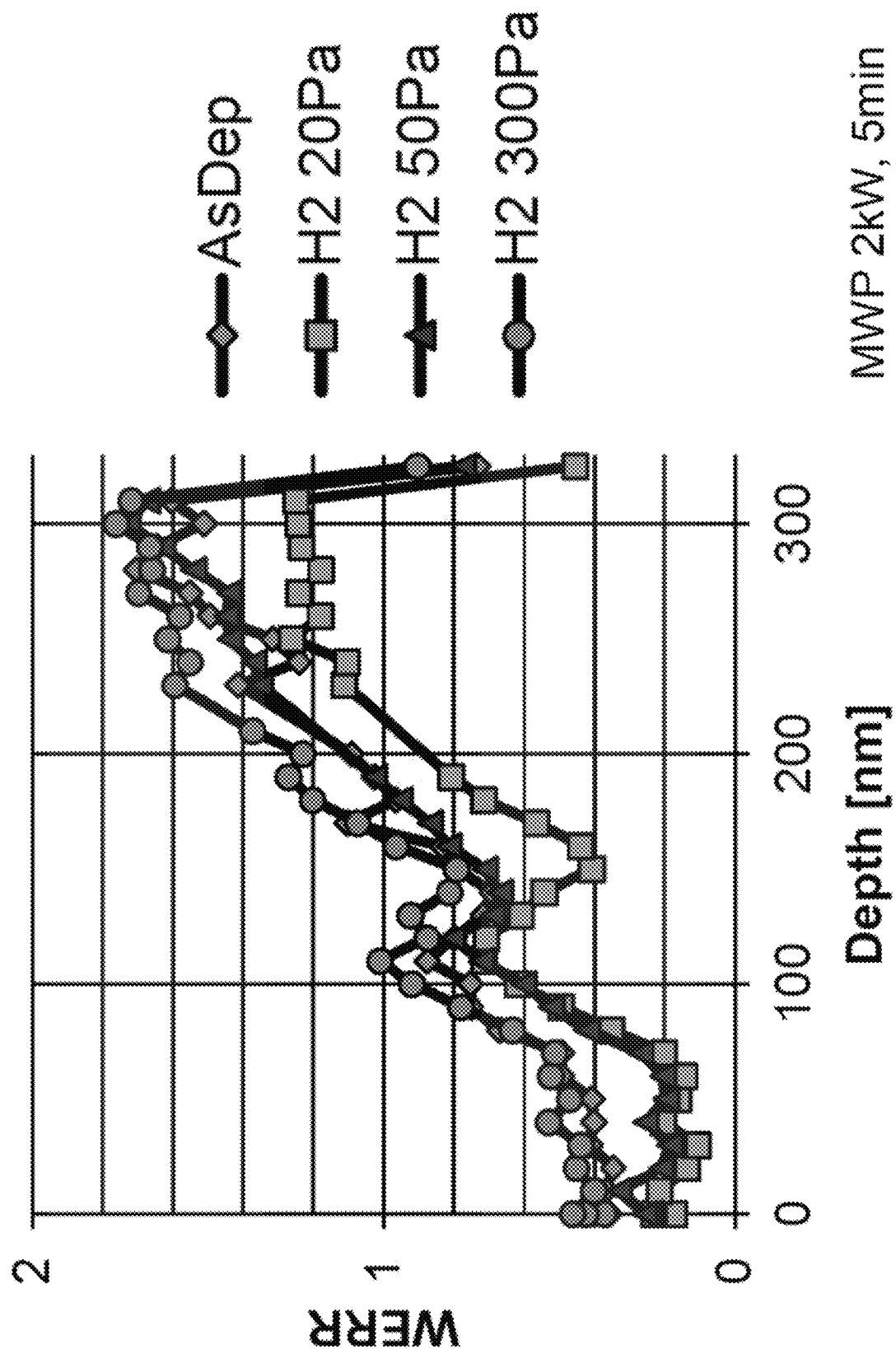
FIGS. 3-6 illustrate wet etch rate ratios (WERR) to TOX of PE-ALD deposited silicon nitride films in dilute (1:100) HF acid under various conditions in accordance with exemplary embodiments of the disclosure.

FIGS. 3-6 illustrate wet etch rate ratios (WERR) of PE-ALD deposited silicon nitride films in dilute (1:100) HF acid. As illustrated in FIG. 3, for reforming a silicon nitride film using hydrogen, from pressures ranging from 20 Pa to 300 Pa, no WERR improvement was observed at a reaction chamber pressure of 300 Pa. At 50 Pa, WERR was improved near a surface of the features, but not at depths extending beyond 120 nm. At a pressure of 20 Pa, WERR improvement reached the bottom of the feature.

Figure 4:
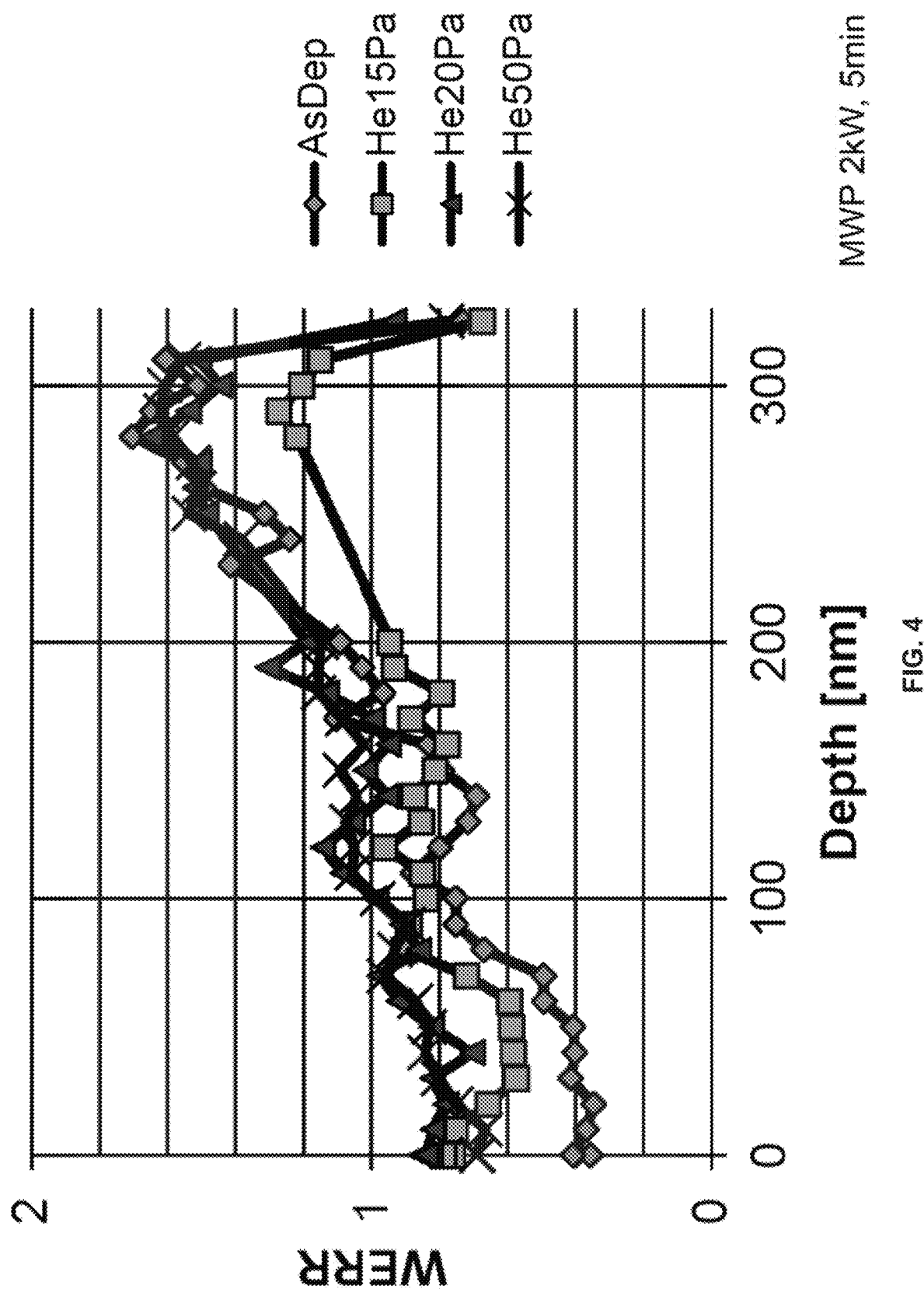

FIG. 4 illustrates WERR as a function of pressure when using helium as a reforming gas.

Figure 5:
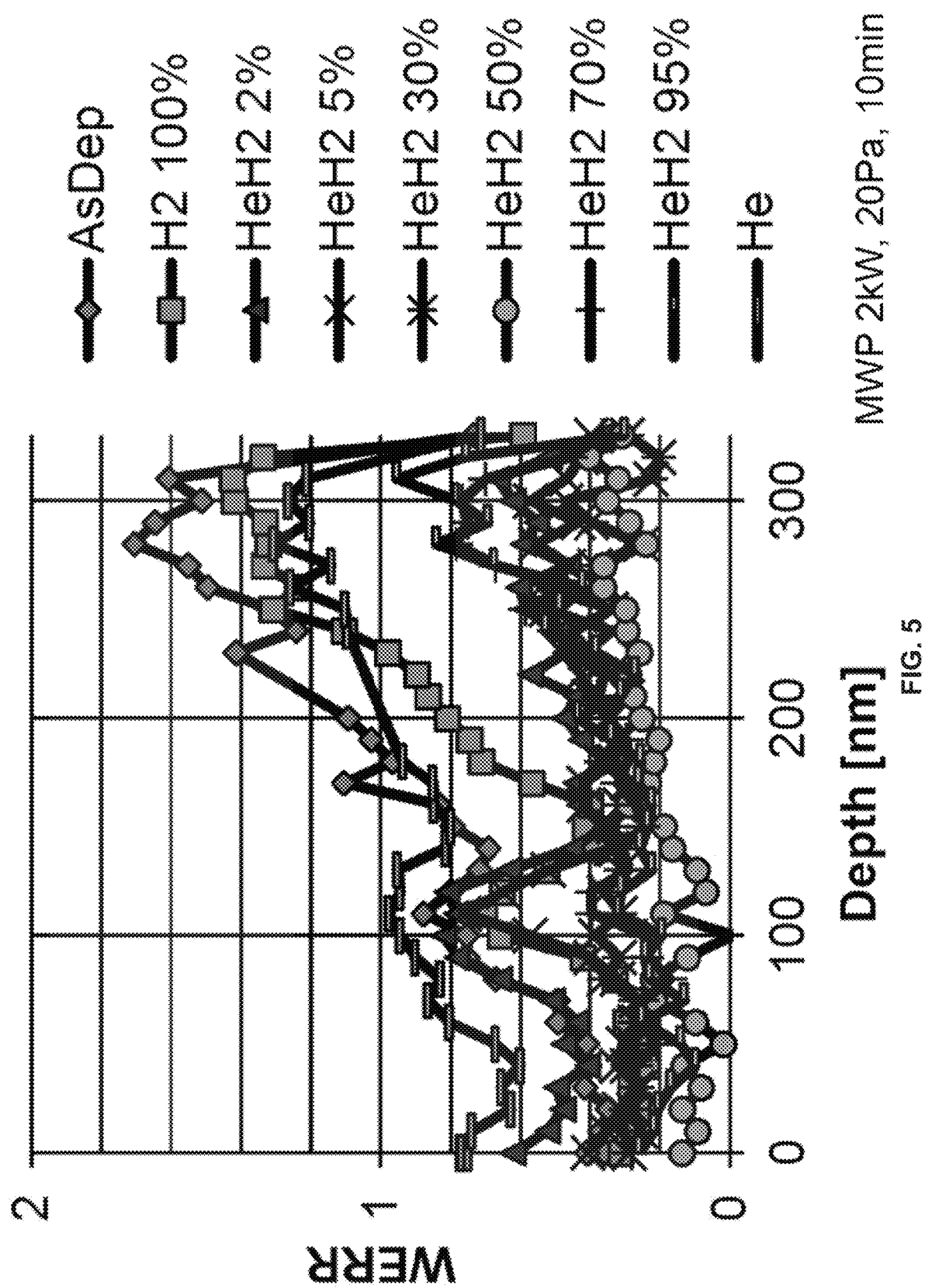

FIG. 5 illustrates the effect of hydrogen addition to helium reforming gas at a given pressure (20 Pa) and power (2 kW) at various depths of a feature. As illustrated, the addition of hydrogen to the reforming gas significantly improved the WERR of the silicon nitride films, with a He:H ratio of about 50:50 showing the most improvement in WERR for these conditions.

Figure 6:
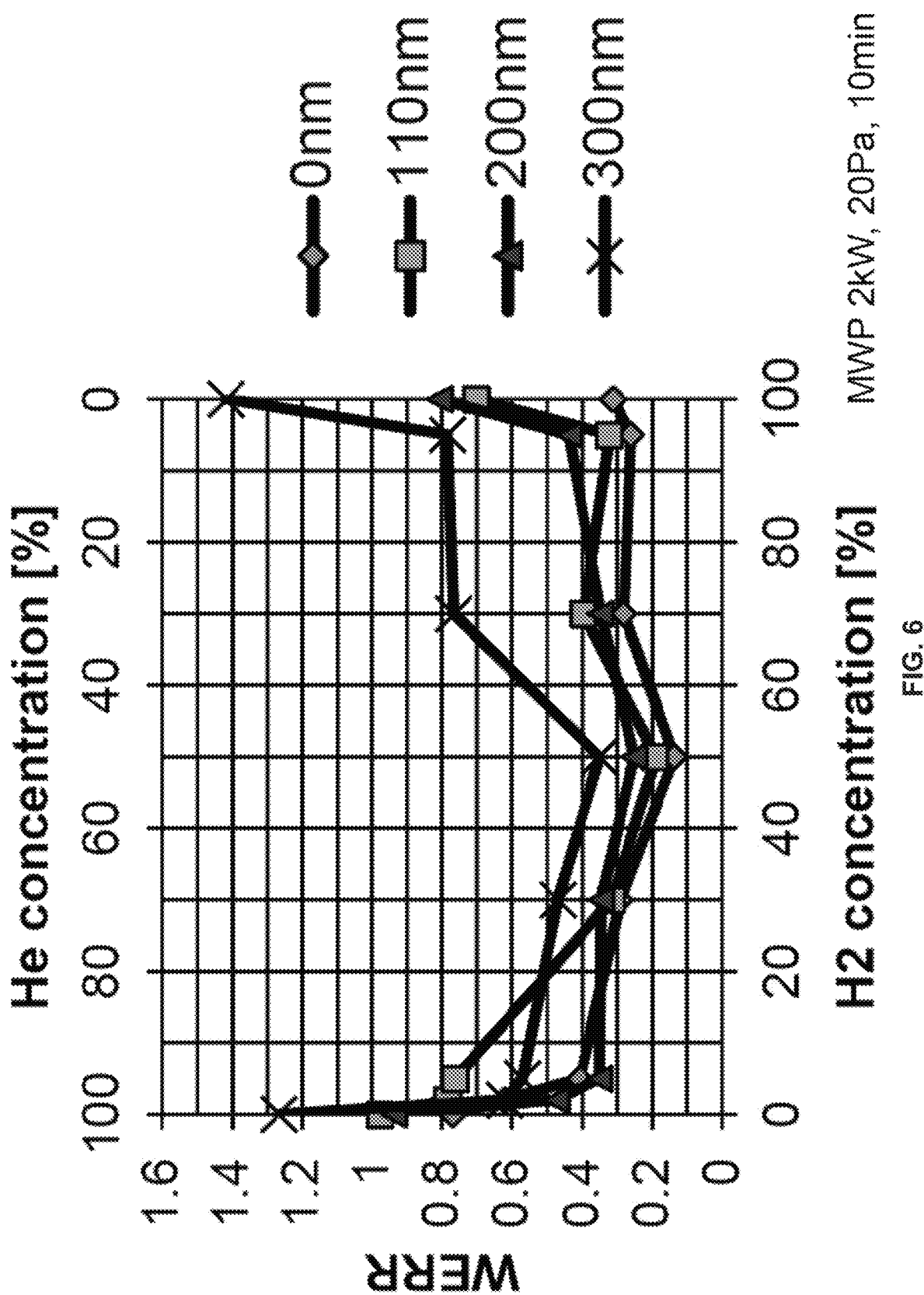

FIG. 6 illustrates WERR at various feature depths as a function of He:H ratios. As illustrated, WERR is improved over a wide range of He:H ratios (e.g., from about 5% to about 95% by volume of hydrogen) with the most improvement in the range of about 40% to about 60% hydrogen/helium.

Figure 7:
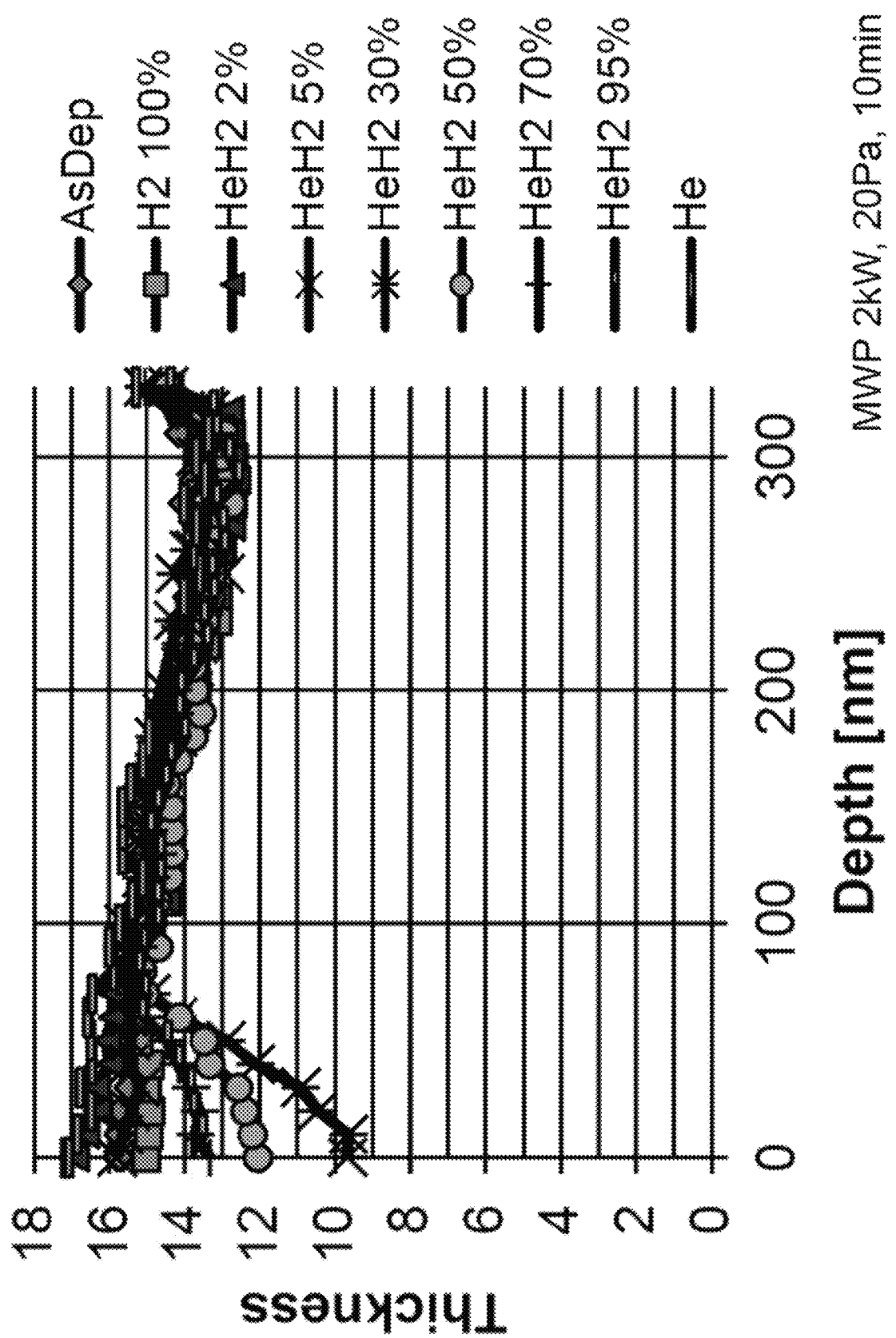
FIG. 7 illustrates thickness of a layer comprising silicon nitride (e.g., SiN) as a function of depth in a feature.
Figure 8:
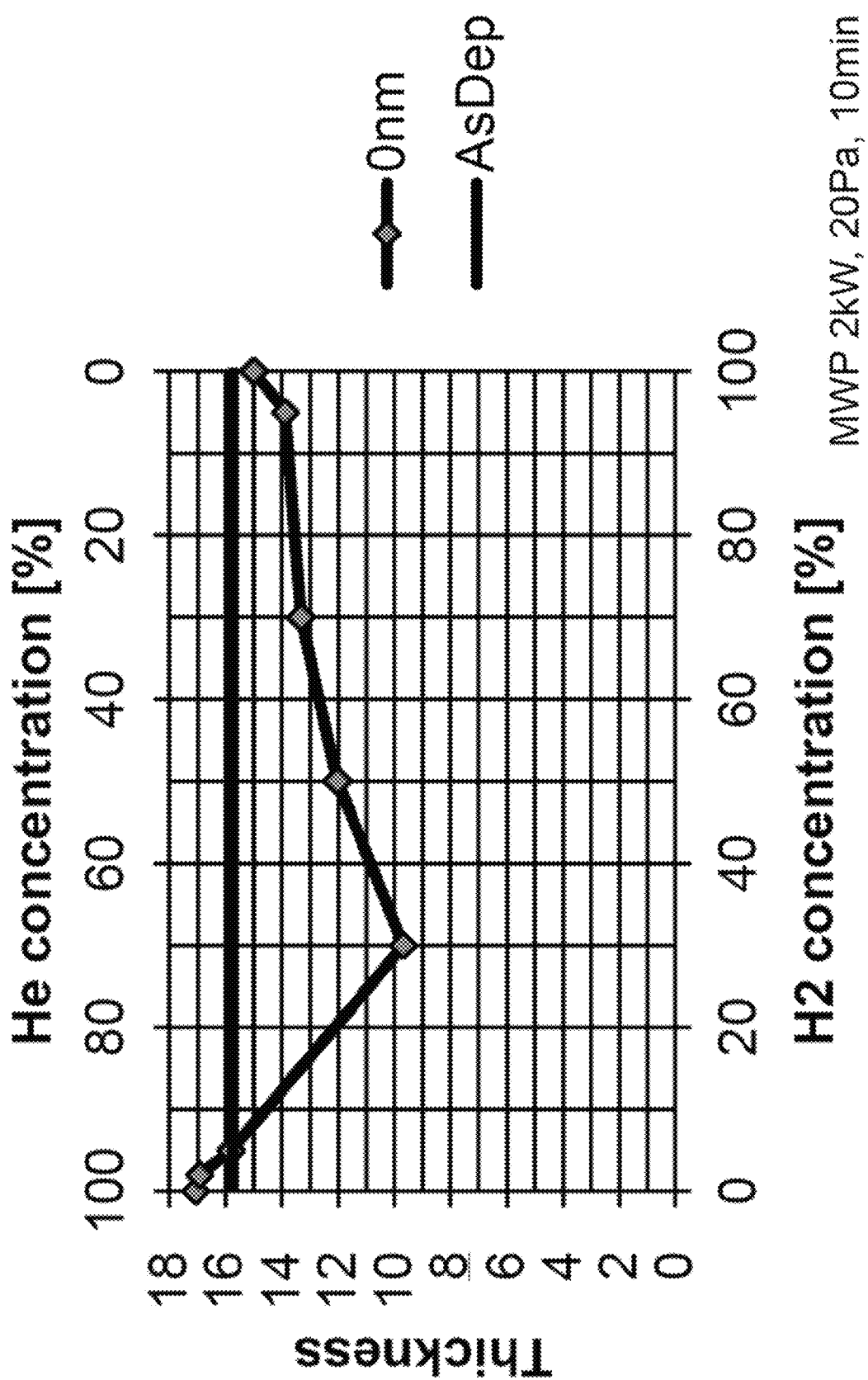
FIG. 8 illustrates thickness at the top of a feature (depth=0) as a function of He:H concentration during a reforming step.

FIG. 7 illustrates thickness of a layer comprising silicon nitride (e.g., SiN) as a function of depth in a feature. The thickness reduction can correspond to damage caused by the microwave plasma. FIG. 8 illustrates thickness at the top of a feature (depth=0) as a function of He:H concentration during a reforming step. FIG. 8 illustrates that a reforming gas including a combination of helium and hydrogen exposed to microwave radiation causes a reduction of the thickness of the layer comprising silicon nitride at the top of the features/pattern.

TABLE 3

| Gas | Time[min] | Ini[nm] | Aft[nm] | Diff[nm] |
|---|---|---|---|---|
| He:H$_2$ = 50:50 | 10 | 5.507 | 4.7607 | −0.7463 |
| He:H$_2$:N$_2$ = 49:49:2 | 10 | 5.499 | 5.5109 | 0.0119 |
| He:H$_2$:N$_2$ = 49:49:2 | 10 | 5.496 | 5.0662 | −0.4298 |

Table 3 illustrates that the addition of a nitrogen source gas to the reforming gas as described herein can suppress the reduction of the thickness of the layer comprising silicon nitride during a reforming process.

Figure 9:
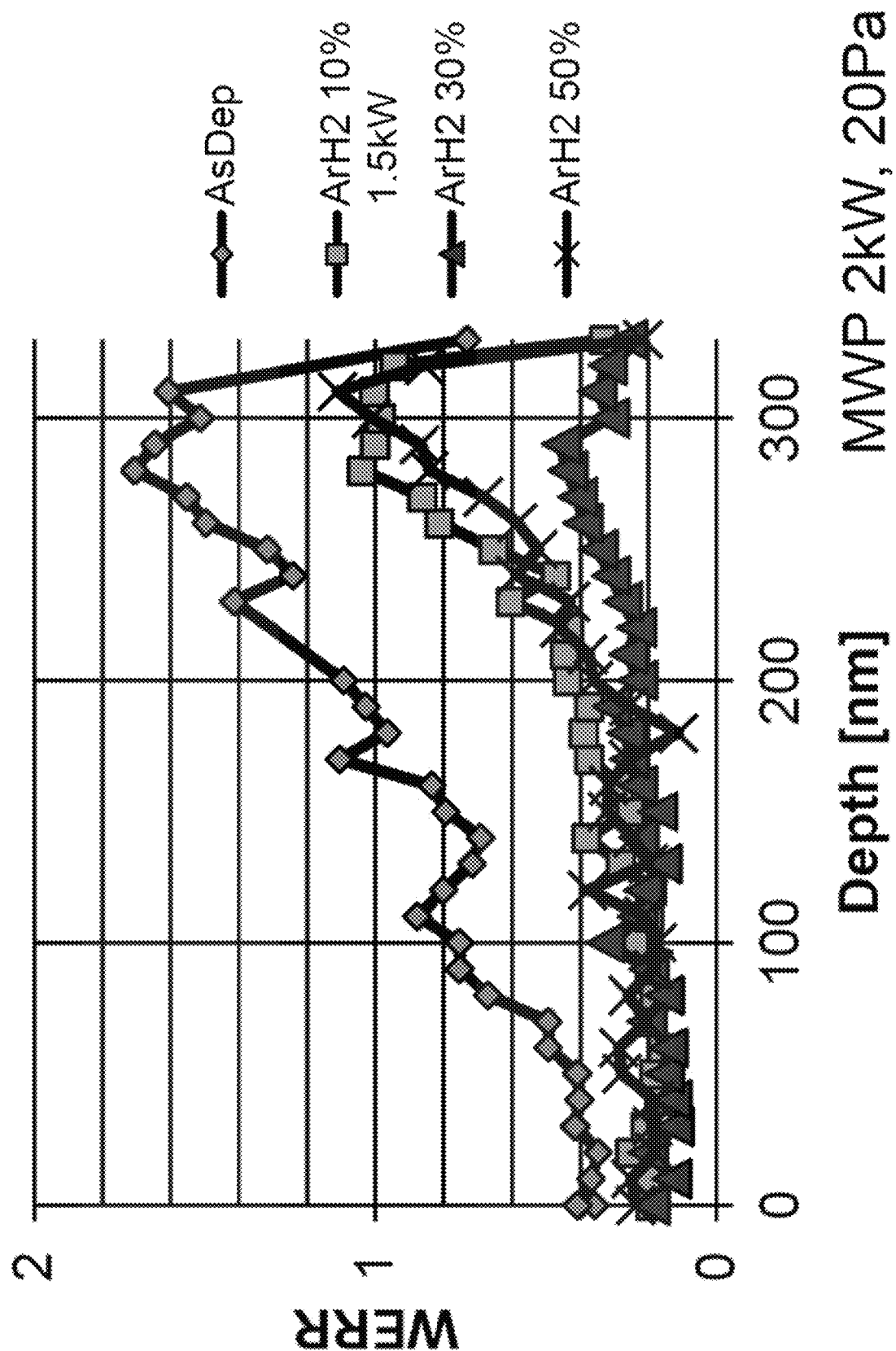
FIGS. 9 and 10 illustrate wet etch rate ratios (WERR) of PE-ALD deposited silicon nitride films in dilute (1:100) HF acid under various conditions in accordance with exemplary embodiments of the disclosure.
Figure 10:
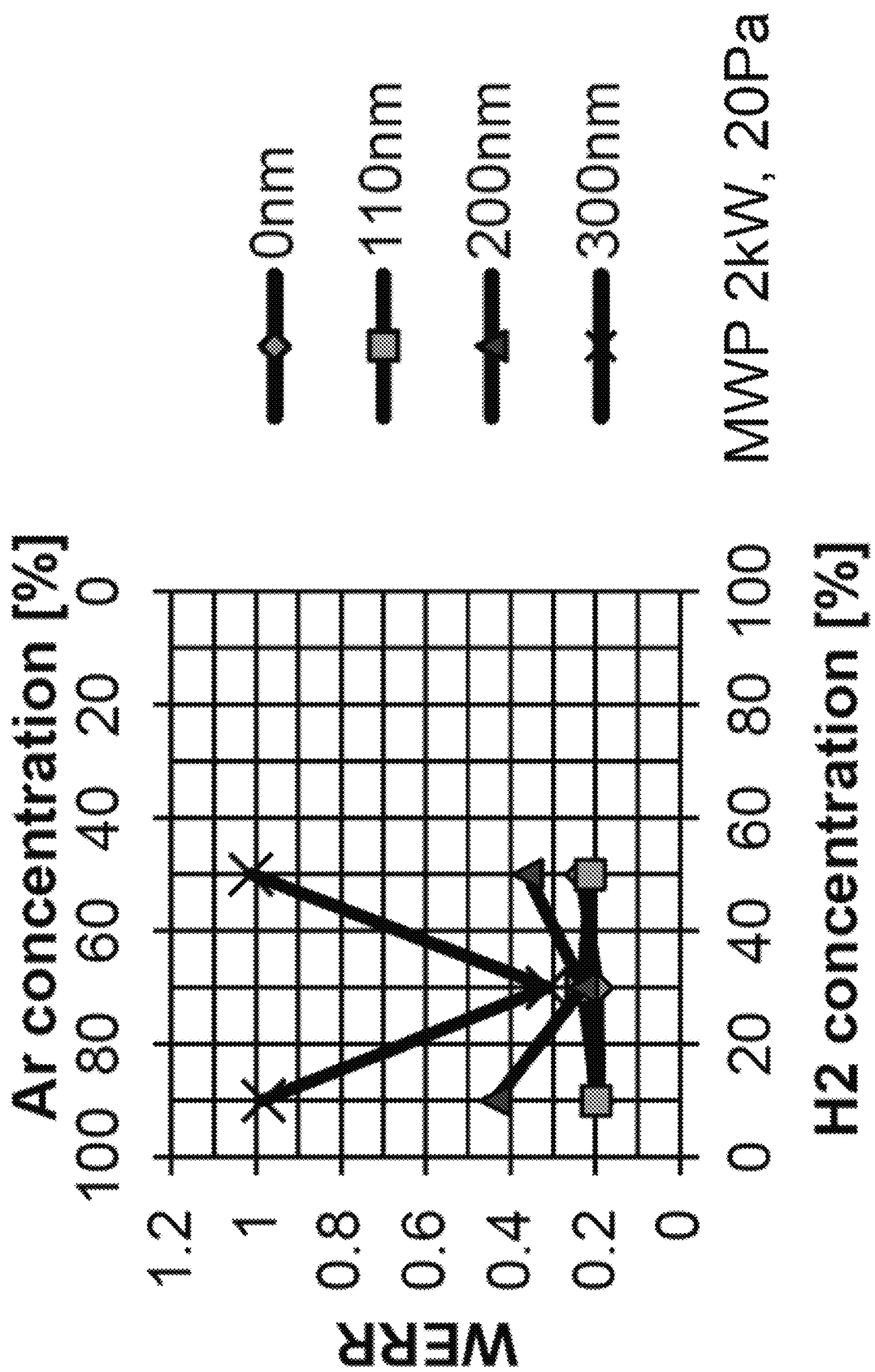
Figure 11:
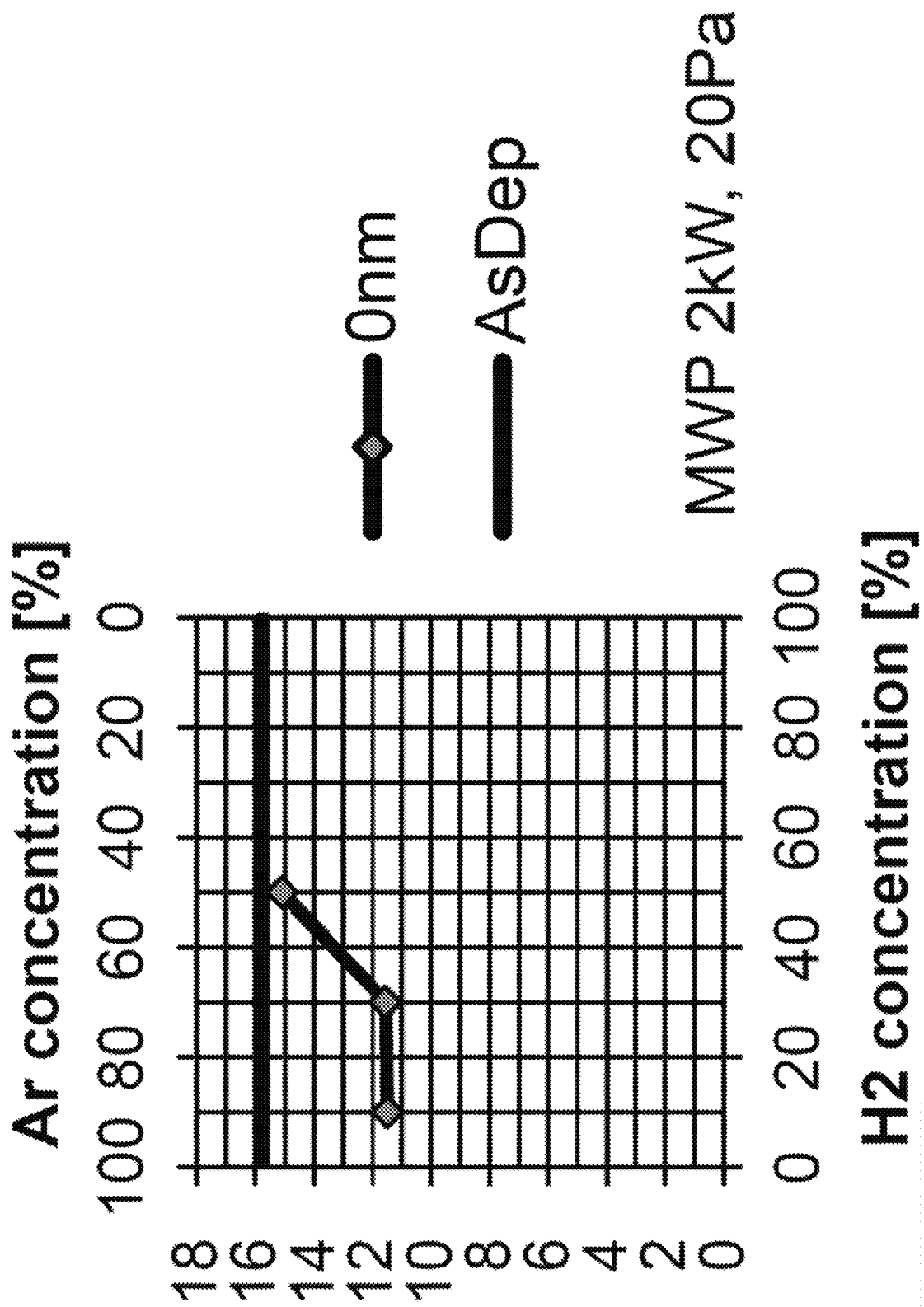
FIG. 11 illustrates damage near a surface of a feature as a function of hydrogen in the hydrogen/argon reforming gas.

FIGS. 9-11 illustrate a WERR and thickness reduction at the top of a feature for a reforming gas that includes argon (rather than helium) and hydrogen. FIG. 9 illustrates that the combination of argon and helium improves the WERR, relative to the as-deposited films. FIG. 10 illustrates an effect of argon and hydrogen concentration on WERR of a PE-ALD silicon nitride film, and that for a given set of conditions (pressure of 20 Pa and microwave power of 2 kW), a concentration of about 30% by volume of hydrogen in argon showed the most improvement in WERR of the films comprising silicon nitride. FIG. 11 illustrates that damage near a surface of a feature was reduced as an amount of hydrogen in the hydrogen/argon reforming gas was increased.

FIGS. 3-11 illustrate that low pressure (e.g., less than 50 Pa) and use of a microwave plasma can reform films comprising silicon nitride along a depth (e.g., to 300 nm or more) of a feature. Helium alone did not appreciably improve WERR along a depth of a feature. This is thought to be due to Si—N bond breaking. On the other hand, activated species formed with helium reach deep areas along a length of a feature. H$_2$ improves WERR, but the effect is diminished along a depth of a feature. A combination of He (and/or argon) and H$_2$ dramatically improves WERR at deep areas of a feature. This is thought to be due to helium and/or argon making it easier to penetrate hydrogen radicals in the SiN film. Damage of the top of the pattern/feature is thought to be primarily due to selective sputtering of N atoms. N atoms are preferentially sputtered by He or H$_2$ ions than Si atoms, because momentum transfer is more effective in N atoms due to atomic mass ratio. Addition of nitrogen source gas can be effective to reduce the damage, because the selective sputtering is compensated with N adsorption.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming an electronic device structure, the method comprising:
providing a substrate on a susceptor within a reaction chamber;
providing a pole-type antenna above the susceptor, the pole-type antenna extending across two sides of the reaction chamber and positioned parallel to the susceptor;
forming activated species by irradiating a reforming gas with microwave radiation emitted from the pole-type antenna; and
exposing a layer on the substrate to the activated species.

2. The method according to claim 1, wherein the reforming gas comprises hydrogen and one or more of helium and argon.

3. The method according to claim 1, wherein the reforming gas comprises hydrogen and helium.

4. The method according to claim 1, wherein the reforming gas comprises a nitrogen source gas.

5. The method according to claim 4, wherein the nitrogen source gas is selected from one or more of the group consisting of N$_2$ and NH$_3$.

6. The method according to claim 1, wherein the reforming gas consists essentially of hydrogen, a nitrogen source gas, and one or more of helium and argon.

7. The method according to claim 1, wherein the reforming gas comprises about 5% to about 95% by volume of He.

8. The method according to claim 1, wherein the reforming gas comprises about 20% to about 70% by volume of He.

9. The method according to claim 1, wherein the pole-type antenna is enclosed in a tube, the tube comprising quartz or ceramic.

10. The method according to claim 1, wherein the reforming gas comprises about 40% to about 60% by volume of H.

11. The method according to claim 1, wherein the reforming gas comprises greater than 0% and less than 10% by volume of a nitrogen source gas.

12. The method according to claim 1, further comprising providing at least one additional pole-type antenna above the susceptor, wherein the pole-type antennas are provided parallel to each other.

13. The method according to claim 1, wherein the microwave radiation has a frequency of about 800 MHz to about 10 GHz.

14. The method according to claim 1, wherein a microwave power emitting the microwave radiation is between about 500 W and about 10,000 W.

15. The method according to claim 1, wherein the pole-type antenna is provided at a distance of about 5 cm to about 10 cm from the susceptor.

16. The method according to claim 1, wherein no RF power is supplied to the susceptor during the step of forming activated species.

17. The method according to claim 1, wherein the pressure within the reaction chamber during the step of forming activated species is between about 1 Pa and about 50 Pa.

18. The method according to claim 1, wherein a temperature of a susceptor within the reaction chamber during the step of forming activated species is between about 20° C. and about 400° C.

19. The method according to claim 1, further comprising a step of transferring the substrate to a reaction space in a microwave plasma apparatus without exposing the substrate to air.

20. A system for performing the method of claim 1.

* * * * *